(12) United States Patent
Kurosawa

(10) Patent No.: US 7,642,113 B2
(45) Date of Patent: Jan. 5, 2010

(54) SEMICONDUCTOR WAFER DIVIDING METHOD

(75) Inventor: Tetsuya Kurosawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 597 days.

(21) Appl. No.: 11/594,196

(22) Filed: Nov. 8, 2006

(65) Prior Publication Data

US 2007/0105345 A1 May 10, 2007

(30) Foreign Application Priority Data

Nov. 9, 2005 (JP) ............... 2005-325022

(51) Int. Cl.
*H01L 21/00* (2006.01)
*H01L 21/46* (2006.01)

(52) U.S. Cl. .................. 438/33; 438/68; 438/113; 438/114; 438/458; 438/460; 257/E21.599

(58) Field of Classification Search .............. None
See application file for complete search history.

(56) References Cited

U.S. PATENT DOCUMENTS

| 5,904,548 | A | * | 5/1999 | Orcutt ................ 438/462 |
| 6,075,280 | A | | 6/2000 | Yung et al. |
| 6,756,562 | B1 | | 6/2004 | Kurosawa et al. |
| 7,211,526 | B2 | * | 5/2007 | Iri et al. ............... 438/797 |
| 7,566,635 | B2 | * | 7/2009 | Fujii et al. ............ 438/462 |
| 2003/0127428 | A1 | | 7/2003 | Fujii et al. |
| 2005/0130390 | A1 | * | 6/2005 | Andrews et al. ........... 438/458 |
| 2005/0272223 | A1 | * | 12/2005 | Fujii et al. ............ 438/459 |
| 2006/0040472 | A1 | * | 2/2006 | Tamura et al. ........... 438/460 |
| 2007/0045779 | A1 | * | 3/2007 | Hiatt .................. 257/621 |

FOREIGN PATENT DOCUMENTS

| CN | 1655327 | 8/2005 |
| JP | 4-118190 | 4/1992 |
| JP | 7-74131 | 3/1995 |
| JP | 11-104869 | 4/1999 |
| JP | 2001-176820 | 6/2001 |
| JP | 2002-192370 | 7/2002 |
| JP | 2002-198326 | 7/2002 |
| JP | 2004-79746 | 3/2004 |
| KR | 10-2005-0106100 | 11/2005 |
| WO | WO 2004/082006 A1 | 9/2004 |

OTHER PUBLICATIONS

Notification for Filing Opinion in copending application 10-2006-109809, mailed Sep. 17, 2007, and English translation thereof.

Notification of the Third Office Action mailed on Feb. 13, 2009, by the Chinese Patent Office in copending Application No. 200610143833.9 and English language translation thereof.

Notification of the First Office Action in copending Chinese application 200610143833.9, mailed Apr. 25, 2008, and English translation thereof.

* cited by examiner

*Primary Examiner*—Matthew C Landau
*Assistant Examiner*—James M Mitchell
(74) *Attorney, Agent, or Firm*—Finnegan, Henderson, Farabow, Garrett & Dunner, L.L.P.

(57) ABSTRACT

An element is formed on the major surface of a semiconductor wafer, and a groove is formed in the back surface of the semiconductor wafer along a dicing line or chip dividing line by a mechanical or chemical method. A modified layer is formed by irradiating the groove with a laser, and the semiconductor wafer is divided by using the modified layer as a starting point. The back surface of the semiconductor wafer is removed to at least the depth of the groove.

19 Claims, 5 Drawing Sheets

SEMICONDUCTOR WAFER DIVIDING METHOD

CROSS-REFERENCE TO RELATED APPLICATIONS

This application is based upon and claims the benefit of priority from prior Japanese Patent Application No. 2005-325022, filed Nov. 9, 2005, the entire contents of which are incorporated herein by reference.

BACKGROUND OF THE INVENTION

1. Field of the Invention

The present invention relates to a semiconductor device fabrication method and, more particularly, to a technique of cutting and dividing a semiconductor wafer having undergone element formation into semiconductor chips.

2. Description of the Related Art

Conventionally, a mechanical method such as using a dicing blade or scriber forms cutting grooves along dicing lines or chip dividing lines of a semiconductor wafer having undergone element formation, and a breaking method or expanding method divides the wafer (e.g., Jpn. Pat. Appln. KOKAI Publication No. 2002-198326). It is also possible to use a method which forms modified layers (brittle layers) by irradiating a wafer along chip dividing lines with a laser or the like, thereby dividing the wafer (e.g., Jpn. Pat. Appln. KOKAI Publication No. 2004-79746).

When the breaking method or expanding method divides a semiconductor wafer, however, the starting point of breakage (cleavage) of the wafer often becomes unstable, allowing the cleavage plane to reach an interconnection region formed inside a chip, thereby producing defective products. This is so because the starting point of cleavage is, e.g., a flaw, strain, or crystal defect produced when a dicing blade or scriber mechanically forms a cutting groove. Also, even when cleavage does not reach the interconnection region and hence has no influence on an internal circuit, variations in chip shape or undulation of the edge pose problems in later steps, thereby decreasing the fabrication yield.

On the other hand, the method which forms modified layers by laser irradiation or the like can avoid the problems of the mechanical method as described above. However, a distance (depth) in the direction of thickness of a chip which can be modified by laser irradiation is presently at most about 20 to 30 μm. To divide a wafer by laser irradiation, it is necessary to modify a distance equal to or larger than the final thickness (the cleavage plane on a side surface) of a semiconductor chip, and equal to or larger than about 50% of the thickness of a wafer when it is divided. For example, when the thickness of a wafer when it is divided is 500 μm and the thickness of a chip when it is finally encapsulated into a package is 100 μm, it is necessary to form a modified layer having a thickness of at least 300 to 400 μm (inclusive). Therefore, a modified layer must be formed by irradiating the same line with a laser about 10 to 13 times while the focal position in the direction of depth (the formation position of the modified layer) is changed. This prolongs the time necessary before cutting, and worsens the productivity.

Also, the back surface of a semiconductor wafer having a diameter of 8 inches or less is a satinized surface. When a laser irradiates the back surface, therefore, no modified layer is formed inside the wafer because the roughened surface irregularly reflects the laser. Accordingly, the back surface of the semiconductor wafer must be planarized to a plane surface having a grit of #2000 or more by grinding or etching. This reduces productivity.

BRIEF SUMMARY OF THE INVENTION

According to an aspect of the present invention, there is provided a semiconductor device fabrication method comprising forming an element on a major surface of a semiconductor wafer, forming a groove in a back surface of the semiconductor wafer along one of a dicing line and a chip dividing line by one of a mechanical method and a chemical method, forming a modified layer in a position of the semiconductor wafer deeper than the groove by irradiating the groove with a laser, dividing the semiconductor wafer by using the modified layer as a starting point, and removing the back surface of the semiconductor wafer to at least a depth of the groove.

According to another aspect of the present invention, there is provided a semiconductor device fabrication method comprising forming an element on a major surface of a semiconductor wafer, forming a groove with a first depth in a back surface of the semiconductor wafer along one of a dicing line and a chip dividing line, forming a modified layer with a second depth smaller than the first depth in a position of the semiconductor wafer deeper than the groove by irradiating the groove with a laser, dividing the semiconductor wafer by cleavage by using the modified layer as a starting point, and forming a semiconductor chip whose sidewall is a cleavage plane by removing the back surface of the semiconductor wafer to a sum of the first depth and the second depth.

According to still another aspect of the present invention, there is provided a semiconductor device fabrication method comprising forming an element on a major surface of a semiconductor wafer, forming a groove with a first depth in a back surface of the semiconductor wafer along one of a dicing line and a chip dividing line, the groove being formed such that a second depth of one scan which is modifiable by laser irradiation remains in the back surface of the semiconductor wafer, forming a modified layer reaching the major surface of the semiconductor wafer by irradiating the groove with a laser, dividing the semiconductor wafer by using the modified layer as a starting point, and forming a semiconductor chip whose sidewall is the modified layer by removing the back surface of the semiconductor wafer to at least the first depth.

DETAILED DESCRIPTION OF THE INVENTION

First Embodiment

FIGS. 1 to 4 are sectional views for explaining a semiconductor device fabrication method according to the first embodiment of the present invention, which sequentially show main parts of semiconductor device fabrication steps by noting semiconductor wafer dividing steps.

First, various semiconductor elements are formed in the major surface region of a semiconductor wafer by well-known fabrication steps.

Then, a transparent surface protective tape (holding tape) is affixed to the major surface of the semiconductor wafer having undergone element formation.

Figure 1:
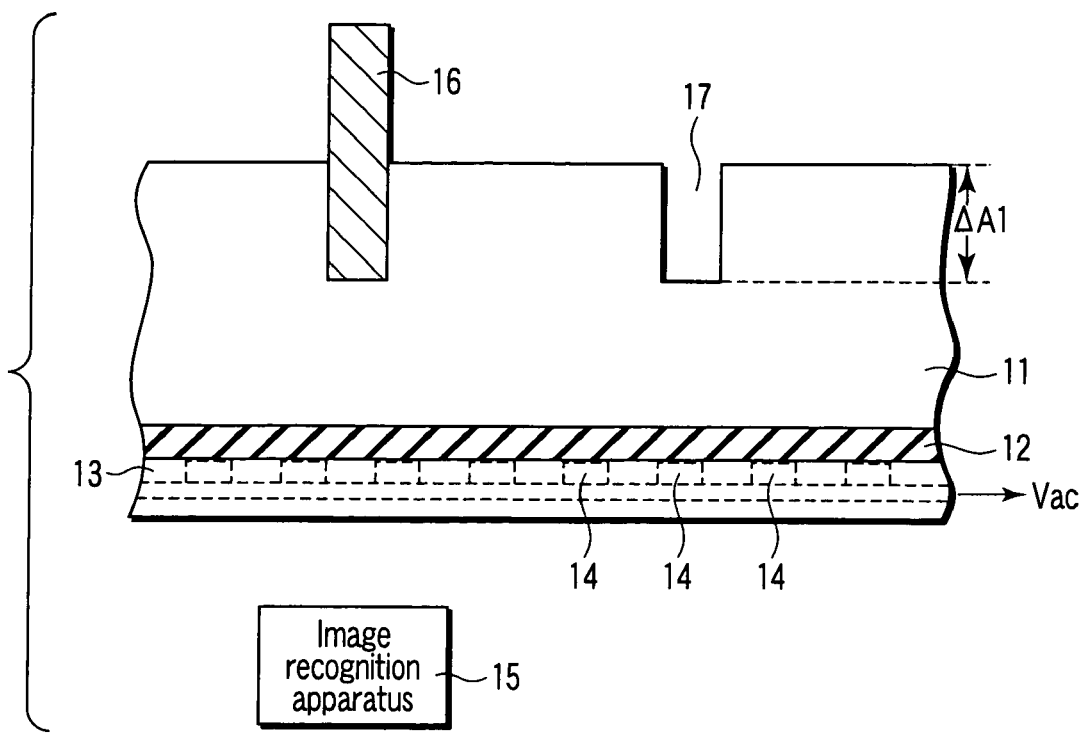
FIG. 1 is a sectional view for explaining a semiconductor device fabrication method according to the first embodiment of the present invention, which shows the first fabrication step.

After that, as shown in FIG. 1, the major surface side (the side of a surface protective tape 12) of a semiconductor wafer 11 is fixed to a table 13. The table 13 is transparent and has suction holes 14 for holding the wafer 11 by suction. A vacuum Vac draws the surface protective tape 12 to the suction holes 14 by suction, thereby fixing the semiconductor wafer 11.

An image recognition apparatus 15 is placed below the lower surface of the table 13. The image recognition apparatus 15 has, e.g., an IR microscope, and acquires information of, e.g., dicing lines (or chip dividing lines) or the positions of grooves to be formed in the wafer 11, on the basis of an image or pattern formed on the major surface of the semiconductor wafer 11.

While the semiconductor wafer 11 is fixed as described above, grooves 17 having a depth $\Delta A1$ are formed in the back surface of the wafer 11 by using a dicing blade 16 (or etching or the like). The grooves 17 are formed along the dicing lines (or chip dividing lines) by taking account of the crystal direction (cleavage direction) of silicon.

Figure 2:
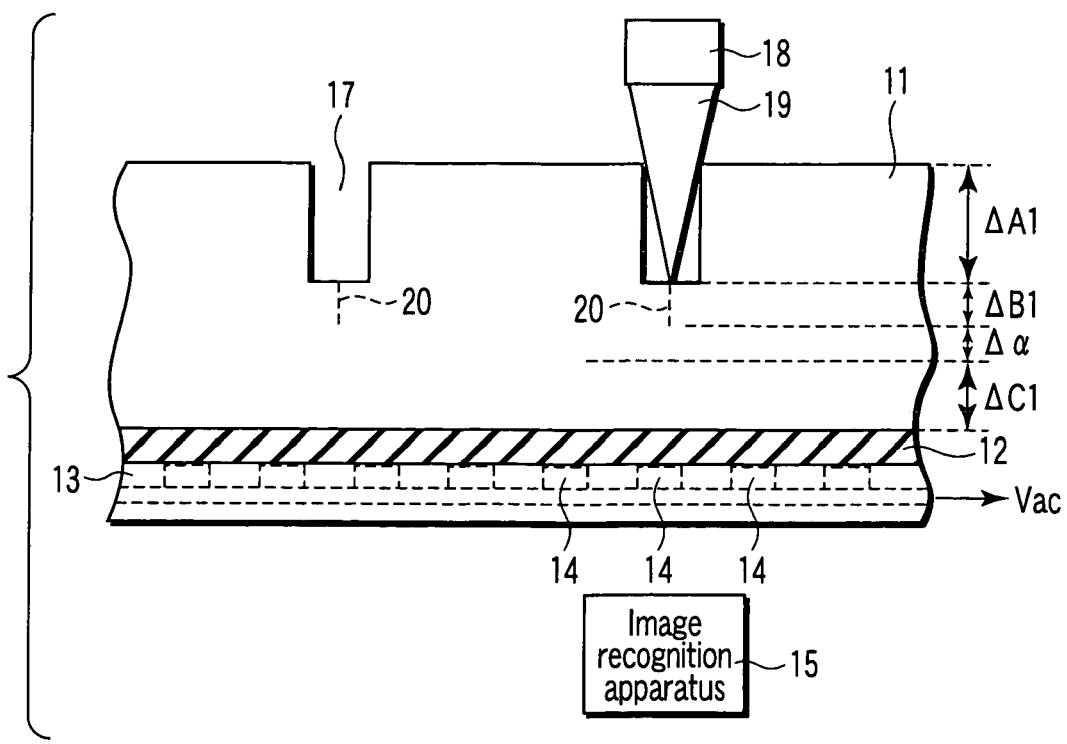
FIG. 2 is a sectional view for explaining the semiconductor device fabrication method according to the first embodiment of the present invention, which shows the second fabrication step.

Subsequently, as shown in FIG. 2, a laser generator 18 irradiates each groove 17 with a laser 19 to form a modified layer (amorphous layer) 20 in the center of the groove 17 or in the center of the cutting area from the back surface by one scan for one dicing line.

The depth $\Delta A1$ of the groove 17 is set larger than the final chip thickness $\Delta C1 + \Delta \alpha$ (margin of back grinding)+depth $\Delta B1$ of one scan which can be modified by laser irradiation. Also, the depth $\Delta B1$ of the modified layer 20 is much smaller than the depth $\Delta A1$ of the groove 17. Furthermore, when the wafer 11 is silicon, the depth $\Delta A1$ of the groove 17 desirably exceeds 60% of the thickness of the wafer 11 because if the depth $\Delta A1$ is equal to or smaller than 60%, the wafer 11 is mechanically difficult to break, and laser scan must be performed a number of times.

Figure 3:
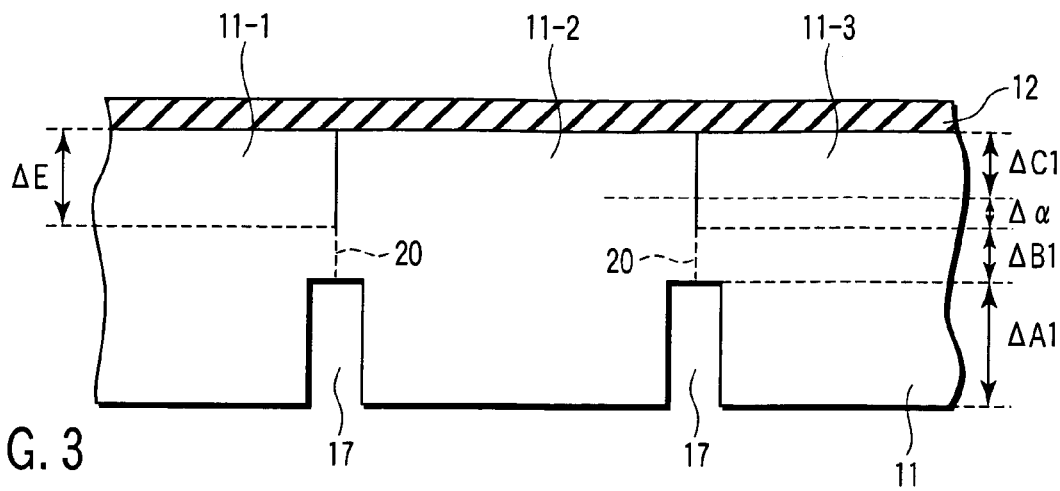
FIG. 3 is a sectional view for explaining the semiconductor device fabrication method according to the first embodiment of the present invention, which shows the third fabrication step.

Next, breaking is performed to cleave the semiconductor wafer 11 by using the modified layers 20 as starting points as shown in FIG. 3, thereby dividing (segmenting) the wafer 11 into semiconductor chips 11-1, 11-2, 11-3, . . . . Consequently, a portion having a thickness $\Delta E$ ($=\Delta C1 + \Delta \alpha$) of the major surface side of the wafer 11 becomes a cleavage plane. The direction of the cleavage plane can be perpendicular to the major surface, and can also be slightly oblique in accordance with the crystal direction of silicon (Si).

Figure 4:
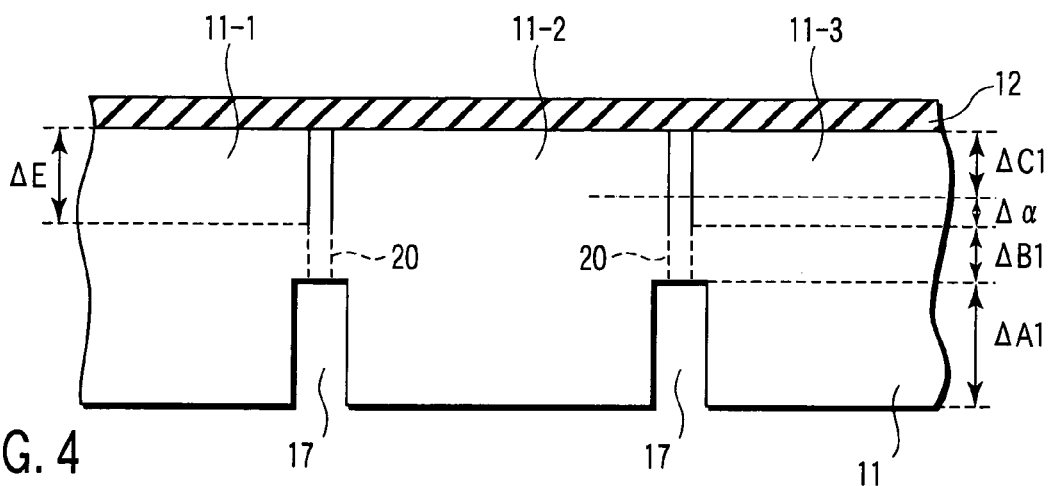
FIG. 4 is a sectional view for explaining the semiconductor device fabrication method according to the first embodiment of the present invention, which shows the fourth fabrication step.

After that, as shown in FIG. 4, the surface protective tape 12 is expanded to extend the spaces between the chips 11-1, 11-2, 11-3, . . . .

Then, the back surface side of the segmented semiconductor wafer 11 is removed by grinding to a predetermined thickness (the final chip thickness $\Delta C1$). This grinding amount is an amount ($=\Delta A1 + \Delta B1 + \Delta \alpha$) by which the grooves 17 and modified layers 20 are completely removed, and only the cleavage plane remains on the side surfaces of the formed semiconductor chips 11-1, 11-2, 11-3, . . . . After this back grinding, planarization can also be performed by etching (dry/wet/gas) or CMP. It is also possible to obtain the predetermined thickness $\Delta C1$ by etching alone without any mechanical grinding.

After that, the surface protective tape 12 is replaced with a pickup tape. This replacement is done by affixing the pickup tape to the back surface side of the segmented semiconductor wafer 11, and removing the surface protective tape 12 (a transfer method).

Then, each chip is removed and picked up from the pickup tape by a collet, and mounted on a board or lead frame by adhesion or bonding.

Finally, packaging is performed, if necessary, by wire bonding or the like to encapsulate the chip in a package, thereby completing a semiconductor device.

The fabrication method as described above divides a semiconductor wafer by the breaking method by cleaving the wafer by using the modified layers formed by laser irradiation as starting points. This makes it possible to increase the stability and accuracy of the starting points of cleavage, and suppress the occurrence of microcracks and the like. Accordingly, it is possible to suppress the variations in chip shape and undulation of the edge, and increase the fabrication yield.

Also, grooves much deeper than the modified layers formed by laser irradiation are formed by, e.g., a dicing blade or etching. This obviates the need to perform laser irradiation a number of times by changing the irradiation position, and increases the productivity. In addition, irradiating the grooves with a laser can suppress irregular reflection of the laser, and can form the modified layers in the wafer.

Furthermore, back grinding removes the dicing regions and modified layers and leaves only the cleavage plane behind. Therefore, it is possible to remove flaws, strain, crystal defects, and the like produced during the formation of the grooves, and also remove thermal damages and contaminants such as flying substances produced by laser irradiation. The fabricated semiconductor chip is damaged and contaminated little, and has high quality with no surface roughness because the side surface is a cleavage plane.

Second Embodiment

FIGS. 5 to 8 are sectional views for explaining a semiconductor device fabrication method according to the second embodiment of the present invention, which sequentially show main parts of fabrication steps by noting semiconductor wafer dividing steps.

First, as in the first embodiment, various semiconductor elements are formed in the major surface region of a semiconductor wafer by well-known fabrication steps, and a transparent surface protective tape (holding tape) is affixed to the major surface of the semiconductor wafer having undergone element formation.

Figure 5:
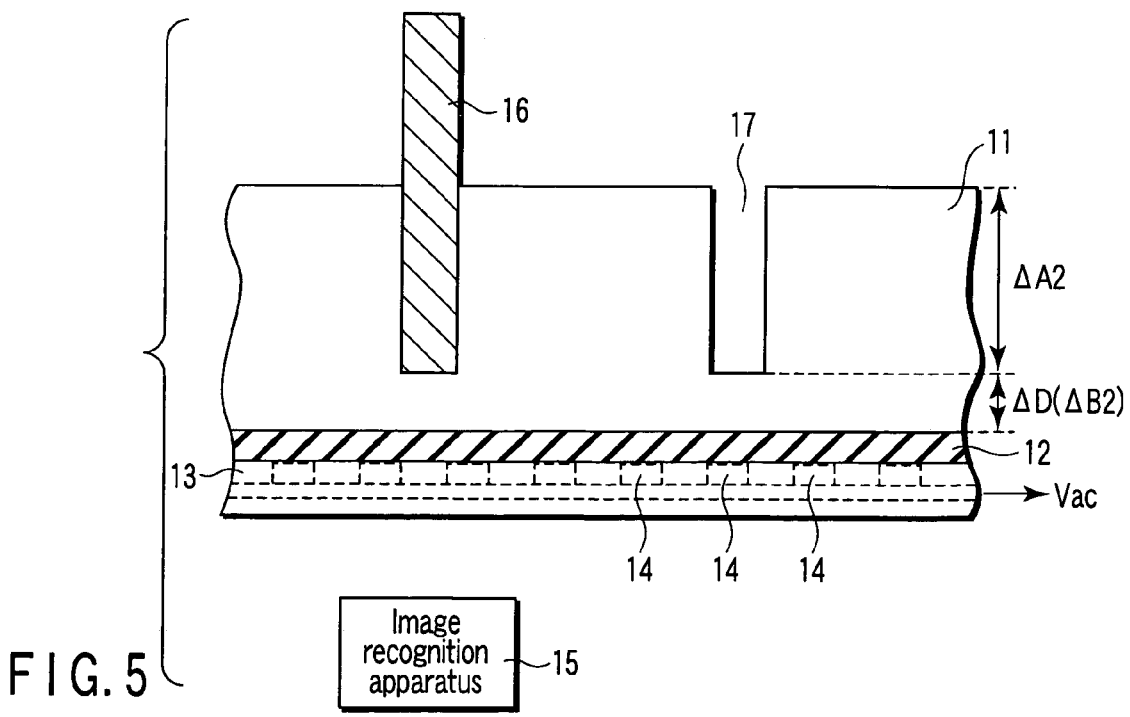
FIG. 5 is a sectional view for explaining a semiconductor device fabrication method according to the second embodiment of the present invention, which shows the first fabrication step.

After that, as shown in FIG. 5, the major surface side (the side of a surface protective tape 12) of a semiconductor wafer 11 is fixed to a table 13. The table 13 is transparent and has suction holes 14 for holding the wafer 11 by suction. A vacuum Vac draws the surface protective tape 12 to the suction holes 14 by suction, thereby fixing the semiconductor wafer 11.

An image recognition apparatus 15 is placed below the lower surface of the table 13. The image recognition apparatus 15 has, e.g., an IR microscope, and acquires information of, e.g., dicing lines (or chip dividing lines) or the positions of grooves to be formed in the wafer 11, on the basis of an image or pattern formed on the major surface of the semiconductor wafer 11.

While the semiconductor wafer 11 is fixed as described above, grooves 17 having a depth $\Delta A2$ are formed in the back surface of the wafer 11 by using a dicing blade 16 (or etching or the like). The grooves 17 are formed along the dicing lines or chip dividing lines. The depth $\Delta A2$ is set such that the remaining portion of the wafer 11 has a depth $\Delta D$ ($=\Delta B2$) of one scan which can be modified by laser irradiation.

Figure 6:
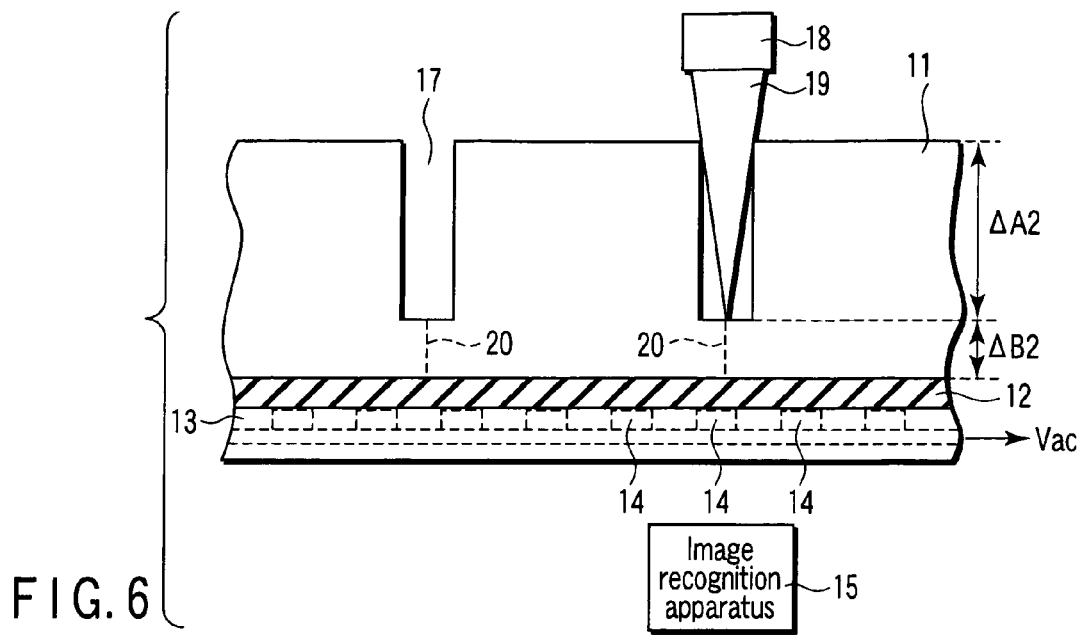
FIG. 6 is a sectional view for explaining the semiconductor device fabrication method according to the second embodiment of the present invention, which shows the second fabrication step.

Subsequently, as shown in FIG. 6, a laser generator 18 irradiates each groove 17 with a laser 19 to form a modified layer (amorphous layer) 20 reaching the major surface side in the center of the groove 17 or in the center of the cutting area by one scan.

Figure 7:
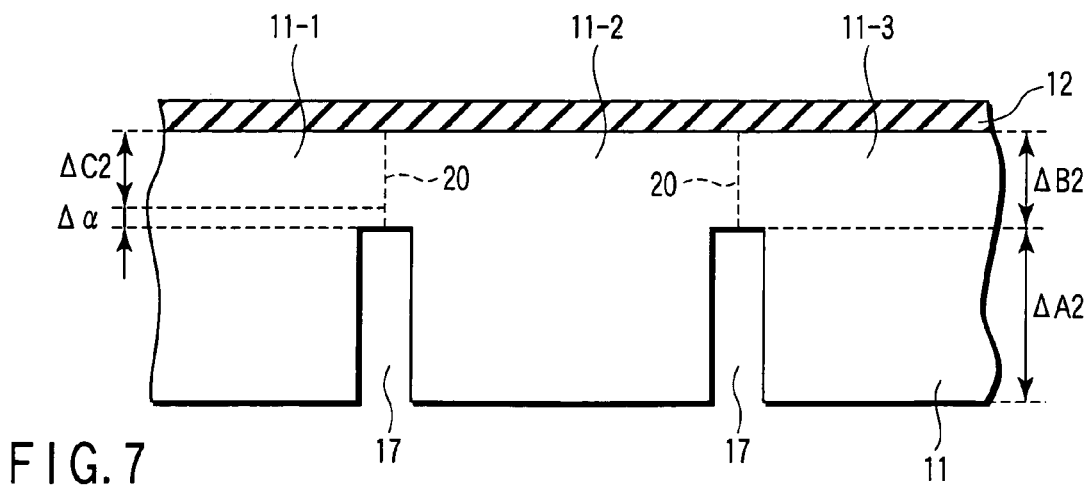
FIG. 7 is a sectional view for explaining the semiconductor device fabrication method according to the second embodiment of the present invention, which shows the third fabrication step.

As shown in FIG. 7, the depth $\Delta A2$ of the groove 17 is set larger than the final chip thickness $\Delta C2+\Delta\alpha$ (margin of back grinding). $\Delta C2+\Delta\alpha$ is equal to the depth $\Delta B2$ of one scan which can be modified by laser irradiation.

Figure 8:
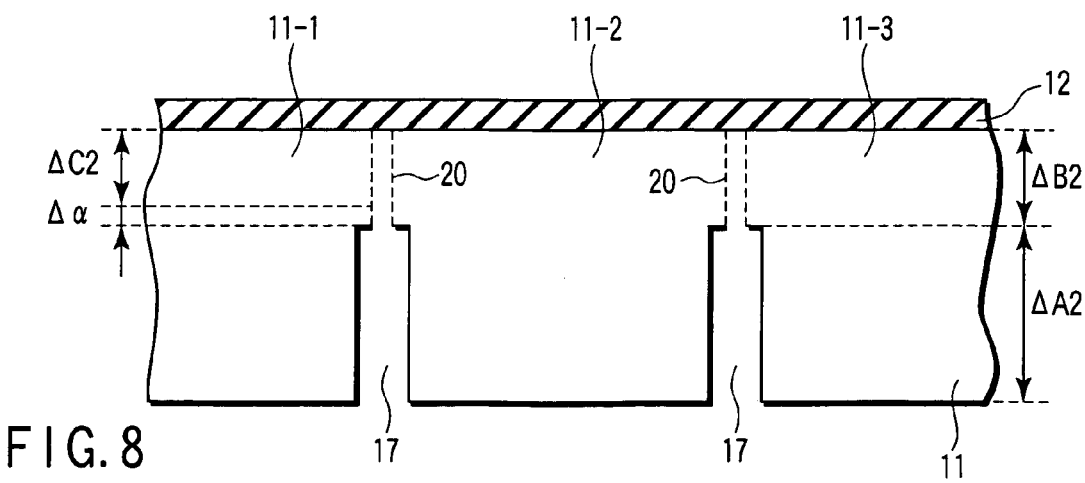
FIG. 8 is a sectional view for explaining the semiconductor device fabrication method according to the second embodiment of the present invention, which shows the fourth fabrication step.

Next, as shown in FIG. 8, the surface protective tape 12 is expanded to extend the spaces between chips 11-1, 11-2, 11-3, . . . , thereby dividing (segmenting) the semiconductor wafer 11 into the individual chips 11-1, 11-2, 11-3, . . . , by using the modified layers 20 as starting points.

After that, the back surface side of the segmented semiconductor wafer 11 is removed by grinding to a predetermined depth (the final chip thickness $\Delta C2$). This grinding amount is an amount ($=\Delta A2+\Delta\alpha$) by which the grooves 17 are completely removed, and only the modified layers 20 remain on the side surfaces of the formed semiconductor chips 11-1, 11-2, 11-3 . . . . After this back grinding, planarization can also be performed by etching (dry/wet/gas) or CMP. It is also possible to obtain the predetermined thickness $\Delta C2$ by etching alone without any mechanical grinding.

Figure 9:
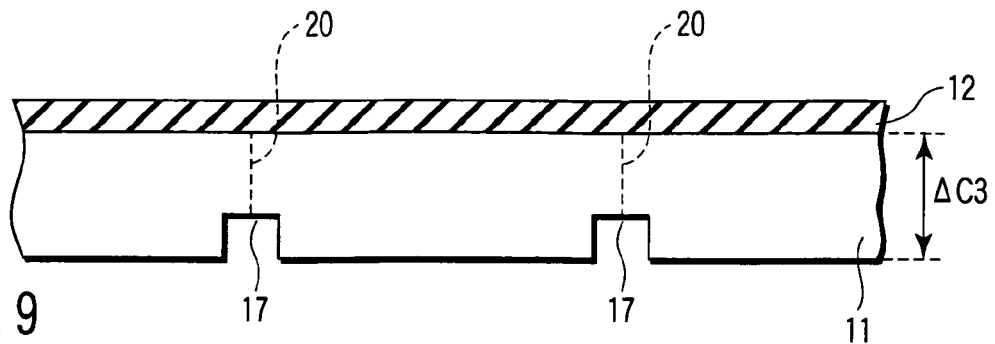
FIG. 9 is a sectional view for explaining the semiconductor device fabrication method according to the second embodiment of the present invention, which shows another example of a back grinding step.

Note that the second embodiment divides the wafer 11 by the modified layers 20 without any cleavage, so cleavage hardly occurs from starting points such as flaws, strain, or crystal defects produced when the grooves 17 are formed. As shown in FIG. 9, therefore, back grinding can also be stopped while the bottom portions of the grooves 17 partially remain.

After that, the surface protective tape 12 is replaced with a pickup tape. This replacement is done by affixing the pickup tape to the back surface side of the segmented semiconductor wafer 11, and removing the surface protective tape 12 (a transfer method).

Then, each chip is removed and picked up from the pickup tape by a collet, and mounted on a board or lead frame by adhesion or bonding.

Finally, packaging is performed, if necessary, by wire bonding or the like to encapsulate the chip in a package, thereby completing a semiconductor device.

The fabrication method as described above divides a semiconductor wafer by the expanding method by using the modified layers formed by laser irradiation as starting points. This makes it possible to increase the stability and accuracy of the starting points of division, and suppress the occurrence of microcracks and the like. Accordingly, it is possible to suppress variations in chip shape and undulation of the edge, and increase the fabrication yield.

Also, grooves much deeper than the modified layers formed by laser irradiation are formed by, e.g., a dicing blade or etching. This obviates the need to form modified layers a number of times by changing the irradiation position in the direction of thickness, and increases the productivity. In addition, irradiating the grooves with a laser can suppress irregular reflection of the laser, and can form the modified layers in the wafer.

Furthermore, since back grinding removes the dicing regions, it is possible to remove flaws, strain, crystal defects, thermal damages, and the like produced during the formation of the grooves. Therefore, the fabricated semiconductor chip is damaged little and has high quality.

Moreover, the semiconductor device fabrication method according to the second embodiment requires no cleaving step, so it is possible to simplify the fabrication process and reduce the fabrication cost compared to the first embodiment. However, the side surface of the fabricated semiconductor chip is the laser modified layer, and the cleavage plane in the first embodiment is smoother and has higher quality. Therefore, the fabrication method can be selected in accordance with the required product.

Note that the present invention is not limited to the first and second embodiments described above and can be variously modified. The first to eighth modifications will be explained below.

(First Modification)

Figure 10:
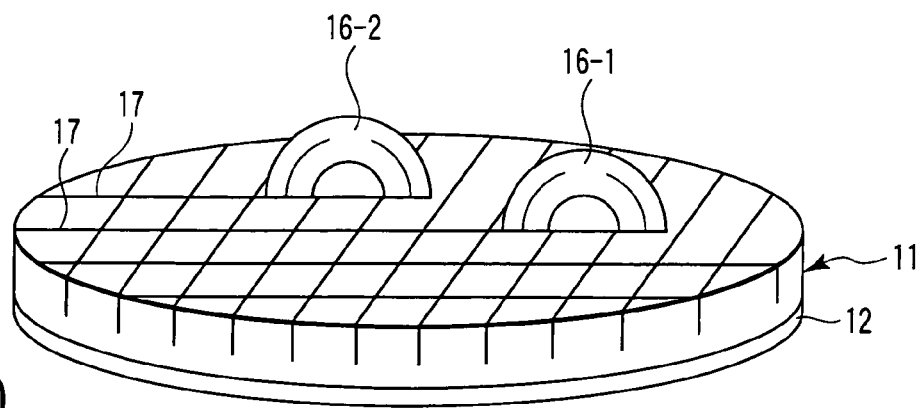
FIG. 10 is a perspective view for explaining the first modification of the present invention, which specifically shows a part of a dicing apparatus used to form grooves in the back surface of a wafer in the first and second embodiments.

FIG. 10 specifically shows a portion of a dicing apparatus used to form the grooves 17 in the back surface of the wafer 11 in the first and second embodiments. This apparatus has two dicing blades 16-1 and 16-2. The dicing blades 16-1 and 16-2 are separated by a distance corresponding to the chip width, and form two grooves 17 by one scan of the rotating shafts of the dicing blades 16-1 and 16-2 (or by table movement).

Forming the grooves 17 in the back surface of the wafer 11 by using this dicing apparatus can reduce the formation time of the grooves 17 substantially by half.

It is of course also possible to further increase the working efficiency by forming the grooves with three or more dicing blades. Furthermore, a plurality of dicing blades can naturally be separated by a distance corresponding to an integral multiple of the chip width.

(Second Modification)

Figure 11:
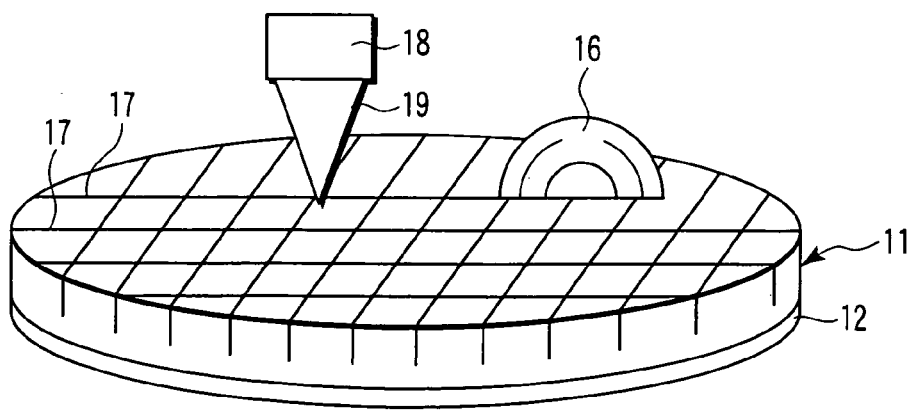
FIG. 11 is a perspective view for explaining the second modification of the present invention, which specifically shows a part of an apparatus used to form grooves and modified layers in the back surface of a wafer in the first and second embodiments.

FIG. 11 specifically shows a portion of an apparatus used to form the grooves 17 in the back surface of the wafer 11 in the first and second embodiments. This apparatus has a dicing blade 16 and laser generator 18. The dicing blade 16 and laser generator 18 are arranged on the same straight line, and form a groove 17 and modified layer 20 by one scan (or table movement).

The fabrication time can be reduced by forming the grooves 17 and modified layers 20 by using this apparatus.

It is also possible to arrange the dicing blade 16 and laser generator 18 on adjacent straight lines instead of the same straight line, and form a modified layer 20, while the dicing blade 16 is forming a groove 17, by irradiating an already formed adjacent groove 17 with a laser 19 from the laser generator 18.

(Third Modification)

In the first and second embodiments described above, the image recognition apparatus 15 acquires information of, e.g., dicing lines (or chip dividing lines) or the positions of grooves to be formed in the wafer 11 as an object of dicing, on the basis of an image or pattern formed on the major surface of the wafer 11 via the table 13 on which the wafer 11 is fixed. However, it is also possible to acquire and store the information in the image recognition apparatus 15 beforehand and read the stored information during dicing, instead of directly acquiring the information during dicing.

Furthermore, the image recognition apparatus 15 is placed below the lower surface of the table 13. However, it is also possible to record the information on the back surface side of the wafer 11, and acquire the information from the back surface side by the image recognition apparatus 15 placed above the wafer 11. In this case, the surface protective tape 12 need not be transparent.

(Fourth Modification)

The first and second embodiments have explained examples in which the laser generator 18 irradiates the grooves 17 with the laser 19 to form the modified layers 20. However, if the major surface side of the wafer 11 has no film which reflects a laser, it is also possible to irradiate the major surface side of the wafer 11 with a laser to form the modified layers 20 on the major surface side as starting points of division.

(Fifth Modification)

Figure 12:
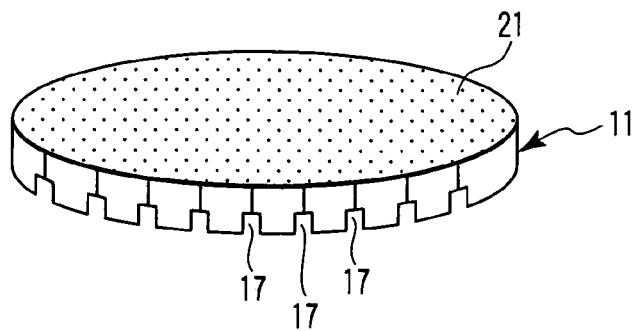
FIG. 12 is a perspective view for explaining the fifth modification of the present invention, which shows a breaking step.

The first embodiment divides a wafer by breaking with the surface protective tape 12 adhering to the wafer. However, as shown in FIG. 12, breaking can also be performed after the surface protective tape 12 has been replaced with a breaking sheet 21.

Figure 13:
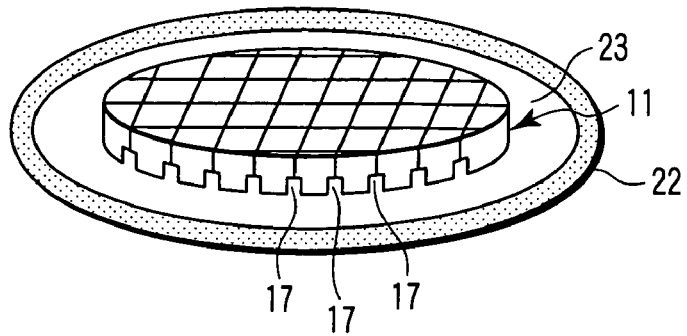
FIG. 13 is a perspective view for explaining the fifth modification of the present invention, which shows another breaking step.

As shown in FIG. 13, it is also possible to affix the back surface of the wafer 11 to an adhesive sheet 23 attached to a wafer ring 22, and break the wafer 11 after the surface protective tape 12 is removed.

Figure 14:
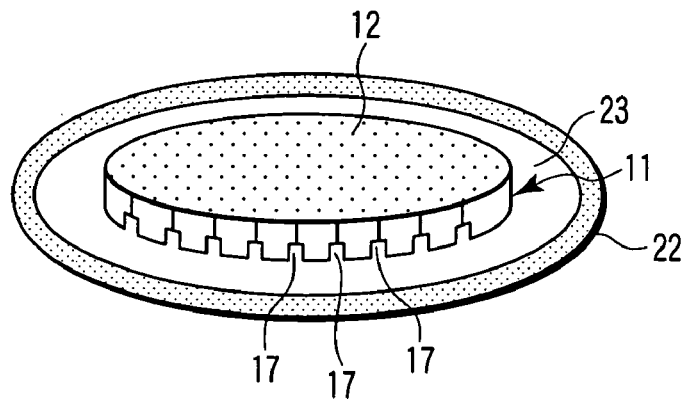
FIG. 14 is a perspective view for explaining the fifth modification of the present invention, which shows still another breaking step.

Alternatively, as shown in FIG. 14, it is also possible to affix the back surface of the wafer 11 to an adhesive sheet 23 attached to a wafer ring 22, and break the wafer 11 with the surface protective tape 12 (or breaking sheet 21) being left behind.

(Sixth Modification)

Figure 15:
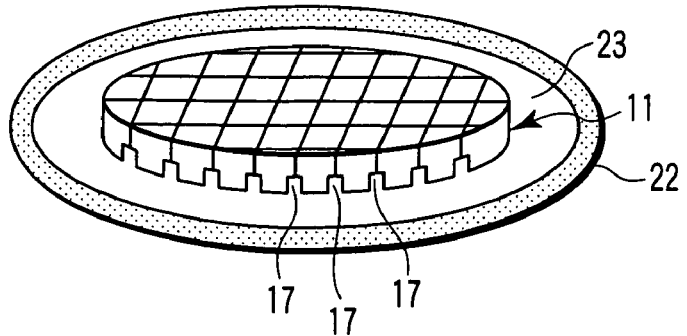
FIG. 15 is a perspective view for explaining the sixth modification of the present invention, which shows a breaking step.

The second embodiment divides a wafer by expanding it with the surface protective tape 12 adhering to it. However, as shown in FIG. 15, it is also possible to affix the back surface of the wafer 11 to an adhesive sheet 23 attached to a wafer ring 22, and expand the wafer 11 after the surface protective tape 12 is removed.

(Seventh Modification)

The first and second embodiments replace the surface protective tape 12 with a pickup tape. However, if the pickup apparatus has a mechanism which turns a chip upside down, or if chips are to be packed into a tray, individual semiconductor chips can also be removed directly from the surface protective tape 12 and picked up.

(Eighth Modification)

The first and second embodiments have explained examples in which the surface protective tape 12 is affixed to the major surface side of the semiconductor wafer 11. However, the major surface side can also be coated with an adhesive resin instead of the surface protective tape 12.

As described above, one aspect of the present invention can provide a semiconductor wafer fabrication method capable of increasing the stability and accuracy of starting points when dividing a semiconductor wafer without decreasing the productivity, thereby increasing the fabrication yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device fabrication method comprising:
   forming an element on a major surface of a semiconductor wafer;
   forming a groove in a back surface of the semiconductor wafer along one of a dicing line and a chip dividing line by one of a mechanical method and a chemical method;
   forming a modified layer in a position of the semiconductor wafer deeper than the groove by irradiating the groove with a laser;
   dividing the semiconductor wafer by using the modified layer as a starting point; and
   removing the back surface of the semiconductor wafer to at least a depth of the groove.

2. A method according to claim 1, wherein the mechanical method forms a groove in the back surface of the semiconductor wafer by using a dicing blade.

3. A method according to claim 1, wherein the chemical method forms a groove in the back surface of the semiconductor wafer by etching.

4. A method according to claim 1, wherein dividing the semiconductor wafer cleaves the semiconductor wafer by breaking.

5. A method according to claim 1, wherein dividing the semiconductor wafer separates the modified layer by expanding a tape adhering to the semiconductor wafer.

6. A semiconductor device fabrication method comprising:
   forming an element on a major surface of a semiconductor wafer;
   forming a groove with a first depth in a back surface of the semiconductor wafer along one of a dicing line and a chip dividing line;

forming a modified layer with a second depth smaller than the first depth in a position of the semiconductor wafer deeper than the groove by irradiating the groove with a laser;

dividing the semiconductor wafer by cleavage by using the modified layer as a starting point; and forming a semiconductor chip whose sidewall is a cleavage plane by removing the back surface of the semiconductor wafer to a sum of the first depth and the second depth.

7. A method according to claim 6, wherein forming the groove forms a groove in the back surface of the semiconductor wafer by using a dicing blade.

8. A method according to claim 6, wherein forming the groove forms a groove in the back surface of the semiconductor wafer by etching.

9. A method according to claim 6, wherein forming the modified layer modifies the semiconductor wafer in the groove by scanning the laser which irradiates the groove once.

10. A method according to claim 6, wherein dividing the semiconductor wafer by cleavage cleaves the semiconductor wafer by breaking.

11. A method according to claim 6, further comprising affixing a surface protective tape to the major surface of the semiconductor wafer after forming the element, and extending a space between semiconductor chips by expanding the surface protective tape after dividing the semiconductor wafer by cleavage.

12. A method according to claim 6, wherein the first depth of the groove is larger than a sum of a thickness of the formed semiconductor chip, a margin of grinding, and the second depth.

13. A method according to claim 6, wherein the first depth of the groove exceeds 60% of a thickness of the semiconductor wafer.

14. A semiconductor device fabrication method comprising:

forming an element on a major surface of a semiconductor wafer;

forming a groove with a first depth in a back surface of the semiconductor wafer along one of a dicing line and a chip dividing line, the groove being formed such that a second depth of one scan which is modifiable by laser irradiation remains in the back surface of the semiconductor wafer;

forming a modified layer reaching the major surface of the semiconductor wafer by irradiating the groove with a laser;

dividing the semiconductor wafer by using the modified layer as a starting point; and forming a semiconductor chip whose sidewall is the modified layer by removing the back surface of the semiconductor wafer to at least the first depth.

15. A method according to claim 14, wherein the first depth of the groove is larger than a sum of a thickness of the formed semiconductor chip and a margin of grinding.

16. A method according to claim 14, wherein forming the groove forms a groove in the back surface of the semiconductor wafer by using a dicing blade.

17. A method according to claim 14, wherein forming the groove forms a groove in the back surface of the semiconductor wafer by etching.

18. A method according to claim 14, wherein forming the modified layer forms a modified layer by scanning the laser which irradiates the groove once.

19. A method according to claim 14, which further comprises affixing a surface protective tape to the major surface of the semiconductor wafer after forming the element, and in which dividing the semiconductor wafer separates the semiconductor wafer by using the modified layer as a starting point by expanding the surface protective tape.

* * * * *